United States Patent
Chang et al.

(10) Patent No.: US 7,668,024 B2
(45) Date of Patent: Feb. 23, 2010

(54) HYBRID STATIC AND DYNAMIC SENSING FOR MEMORY ARRAYS

(75) Inventors: Leland Chang, New York, NY (US); Robert K. Montoye, Jersey City, NJ (US); Yutaka Nakamura, Kyoto (JP)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 11/929,875

(22) Filed: Oct. 30, 2007

(65) Prior Publication Data

US 2009/0109780 A1   Apr. 30, 2009

(51) Int. Cl.
*G11C 7/06* (2006.01)
(52) U.S. Cl. .............. 365/189.15; 365/189.12; 365/189.08; 365/203; 365/196
(58) Field of Classification Search ............... 365/190, 365/196, 205, 208, 207, 189.08, 203, 189.15, 365/189.12
See application file for complete search history.

(56) References Cited

U.S. PATENT DOCUMENTS 7,136,296 B2 * 11/2006 Luk et al. ............... 365/154

7,242,629 B2 * 7/2007 Luk et al. ................ 365/205

FOREIGN PATENT DOCUMENTS

EP    0727932 A2 *   8/1996

OTHER PUBLICATIONS

J. Davis, D. Plass, P. Bunce, Y. Chan, A. Pelella, R. Joshi, A. Chen, W. Huott, T. Knips, P. Patel, K. Lo, E. Fluhr, "A 5.6GHz 64kB Dual-Read Data Cache for the Power6TM Processor," 2006 IEEE International Solid-State Circuits Conference, 1-4244-0079-Jan. 2006 © 2006 IEEE.
J. Dorsey, S. Searles, M. Ciraula, S. Johnson, N. Bujanos, D. Wu, M. Braganza, S. Meyers, E. Fang, R. Kumar, "An Integrated Quad-Core Opteron™ Processor," 2007 IEEE International Solid-State Circuits Conference, ISSCC 2007 / Feb. 12, 2007.
Ram K. Krishnamurthy, Atila Alvandpour, Galesh Balaramurugan, Naresh R. Shanbhag, K. Soumyanath, and Shekhar Y. Borkar, A 130-nm 6-GHz 256 32 bit Leakage-Tolerant Register File, IEEE Journal of Solid-State Circuits, vol. 37, No. 5, May 2002.
J. Pille, C. Adams, T. Christensen, S. Cottier, S. Ehrenreich, F. Kono, D. Nelson, O. Takahashi, S. Tokito, O. Torreiter, O. Wagner, and D. Wendel, "Implementation of the Cell Broadband Engine™ in a 65nm SOI Technology Featuring Dual-Supply SRAM Arrays Supporting 6GHz at 1.3V," ISSCC 2007 / Session 18 / SRAM / 18.1.

* cited by examiner

*Primary Examiner*—Andrew Q Tran
(74) *Attorney, Agent, or Firm*—Michael J. Buchenhorner; Vazken Alexanian

(57) ABSTRACT

A hybrid circuit for a memory includes: a skewed static logic gate circuit; a dynamic pre-discharge device coupled with the skewed static logic gate circuit for operating the static logic gate circuit as a dynamic circuit.

20 Claims, 3 Drawing Sheets

Table 1   Size, Area, Gate Capacitance to LBL, GBL_PD Capacitance
Performance, Cycle and Noise Immunity Comparison

|   |   | Conventional Technology | | Invention |
|---|---|---|---|---|
|   |   | Static | | Dynamic | Hybrid |
|   |   | Balanced | Skewed | | |
| Normalized Size | P10 | 1 | 1 | 1 | 1 |
|   | P11 | 1 | 1 | 1 | 1 |
|   | N10 | 1 | 0.25 |   | 0.25 |
|   | N11 | 1 | 0.25 |   | 0.25 |
|   | N12 |   |   | 0.36 | 0.29 |
| Normalized Area |   | 1 | 0.63 | 0.59 | 0.70 |
| Normalized Gate Capacitance to LBL |   | 1 | 0.63 | 0.50 | 0.63 |
| Normalized GBL_PD Capacitance |   | 1 | 0.93 | 0.94 | 0.96 |
| Normalized Performance |   | 1 | 1.12 | 1.21 | 1.11 |
| Normalized Cycle |   | 1 | 1.62 | 1 | 1 |
| Normalized Noise Immunity |   | 1 | 0.44 | 0 | 0.47 |

Table 1  Size, Area, Gate Capacitance to LBL, GBL_PD Capacitance Performance, Cycle and Noise Immunity Comparison

|  | | Conventional Technology | | | Invention |
|---|---|---|---|---|---|
|  | | Static | | Dynamic | Hybrid |
|  | | Balanced | Skewed | | |
| Normalized Size | P10 | 1 | 1 | 1 | 1 |
|  | P11 | 1 | 1 | 1 | 1 |
|  | N10 | 1 | 0.25 | | 0.25 |
|  | N11 | 1 | 0.25 | | 0.25 |
|  | N12 | | | 0.36 | 0.29 |
| Normalized Area | | 1 | 0.63 | 0.59 | 0.70 |
| Normalized Gate Capacitance to LBL | | 1 | 0.63 | 0.50 | 0.63 |
| Normalized GBL_PD Capacitance | | 1 | 0.93 | 0.94 | 0.96 |
| Normalized Performance | | 1 | 1.12 | 1.21 | 1.11 |
| Normalized Cycle | | 1 | 1.62 | 1 | 1 |
| Normalized Noise Immunity | | 1 | 0.44 | 0 | 0.47 |

FIG. 3

HYBRID STATIC AND DYNAMIC SENSING FOR MEMORY ARRAYS

CROSS-REFERENCE TO RELATED APPLICATIONS

None.

STATEMENT REGARDING FEDERALLY SPONSORED-RESEARCH OR DEVELOPMENT

None.

INCORPORATION BY REFERENCE OF MATERIAL SUBMITTED ON A COMPACT DISC

None.

FIELD OF THE INVENTION

The invention disclosed broadly relates to the field of semiconductor memory and more particularly relates to the field of sensing of semiconductor memory.

BACKGROUND OF THE INVENTION

Whether by frequency scaling or parallelism, as microprocessor performance increases, the demand for high-speed memory grows dramatically. Increasing cache capacity requirements, which are critical to sustain system performance trends, present a trade-off between cache performance and capacity. Since bit line sensing during a read operation comprises a large portion of the cache access time, it is important to develop high-speed sensing strategies.

For high-speed static random access memory (SRAM) and register file array applications, recent trends have shifted away from differential sense amplifier techniques due to the difficulties in minimizing offset voltage under the influence of growing device variability. Instead, hierarchical sensing techniques with full bit line swings are employed using Domino-like circuits, where a pre-charged bit line is tied directly to the input of a static complementary metal oxide semiconductor (CMOS) gate (usually a NAND gate). For example, a register file generally uses 2-stage sensing: a primary domino stage for the Local Bit-Line (LBL) and a secondary stage for the Global Bit-Line (GBL).

As shown in FIG. 1A, a static NAND (A0) 102 is used to sense two LBLs (LBL<0> and LBL<1>), each of which has m sets of memory cell read ports (N0 and N1 or N2 and N3). Both LBLs are pre-charged to VDD (chipset voltage) when LBLP is low, which turns on P0 and P1. One of the two LBLs goes low when the corresponding RWL (redundant word line) is activated and the cell node is high as shown in FIGS. 2a and 2b. The GBL is pre-charged to VDD when GBLP is low, which turns on P20.

A high-to-low transition on LBL changes the output of the static NAND (GBL_PD), which turns on pull-down MOS N20 (one of n sets) to pull down GBL. This can trigger the secondary sense amp, which itself can be another static NAND gate. The value "m×n" is determined by the number of entries in the given memory array, but the specific values of m and n are chosen by balancing performance and array efficiency. The static NAND circuit used in this sensing scheme has excellent immunity to noise on the LBL node (due to the inherent noise rejection capabilities of static circuits), but the performance is poor compared to high-speed dynamic circuits.

To improve the speed of this type of approach, a dynamic NAND (FIG. 1B) can be used instead of a static CMOS. LBL can be thus be sensed faster than in the static NAND case because N12 (102) is turned off (by DYNP) before either P10 or P11 turns on (by LBL evaluation), which eliminates fighting between these transistors. As a result, a drastic improvement in sensing performance can be attained. In addition, a reduced transistor count can also significantly reduce the layout area required.

However, with this dynamic NAND configuration, noise immunity is compromised because noise on the floating LBL node could accidentally discharge the GBL_PD node, which is also floating, thereby resulting in a read error. While the addition of an NFET (negative channel field effect transistor) keeper to the GBL_PD node could address this problem, it would eliminate the speed advantage of the dynamic gate.

SUMMARY OF THE INVENTION

Briefly, according to an embodiment of the invention a hybrid circuit for a memory includes: a skewed static logic gate circuit; a dynamic pre-discharge device coupled with the skewed static logic gate circuit for operating the static logic gate circuit as a dynamic circuit.

BRIEF DESCRIPTION OF THE DRAWINGS

To describe the foregoing and other exemplary purposes, aspects, and advantages, we use the following detailed description of an exemplary embodiment of the invention with reference to the drawings, in which:

FIG. 3 shows the size, area, capacitance, performance (sensing speed), cycle time (sensing speed+pre-charge/restore time, which determines operating frequency), and noise immunity of a circuit according to an embodiment of the invention.

Figures 1A, 1B, 1C:
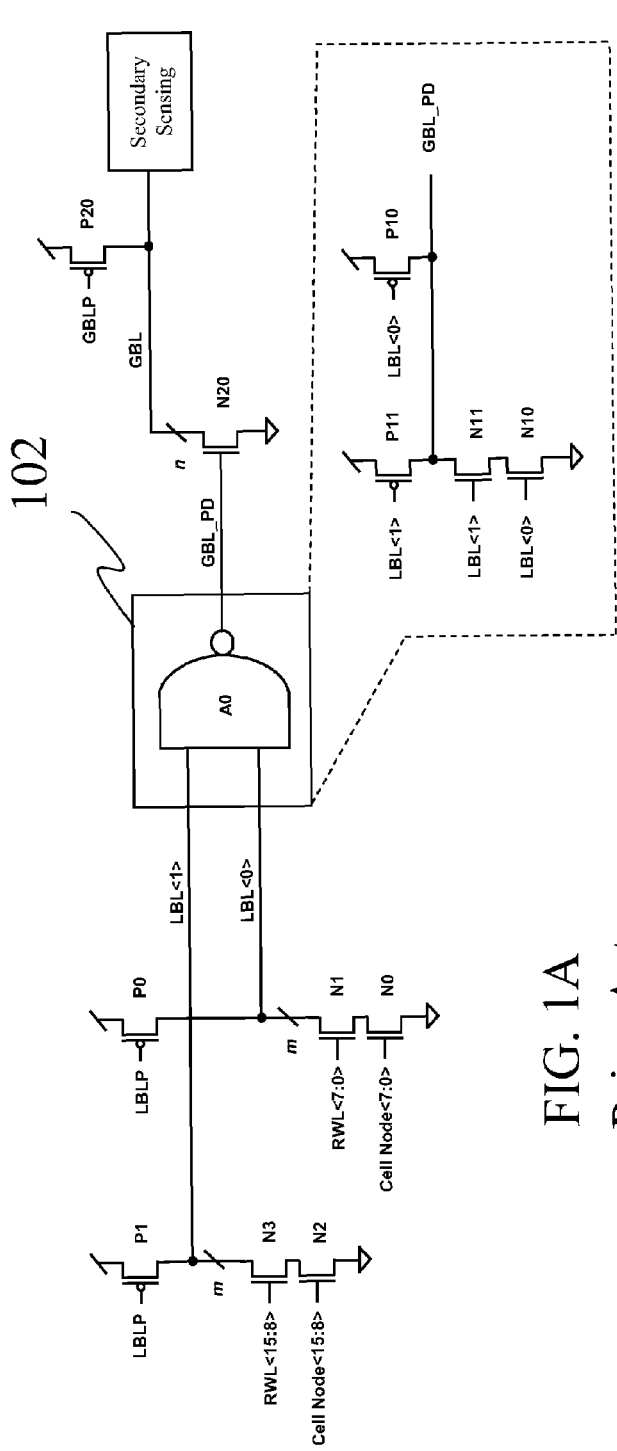
FIG. 1A shows conventional static NAND sensing.
FIG. 1B shows conventional dynamic NAND sensing.
FIG. 1C shows hybrid NAND sensing, according to an embodiment of the present invention.
Figures 2A, 2B:
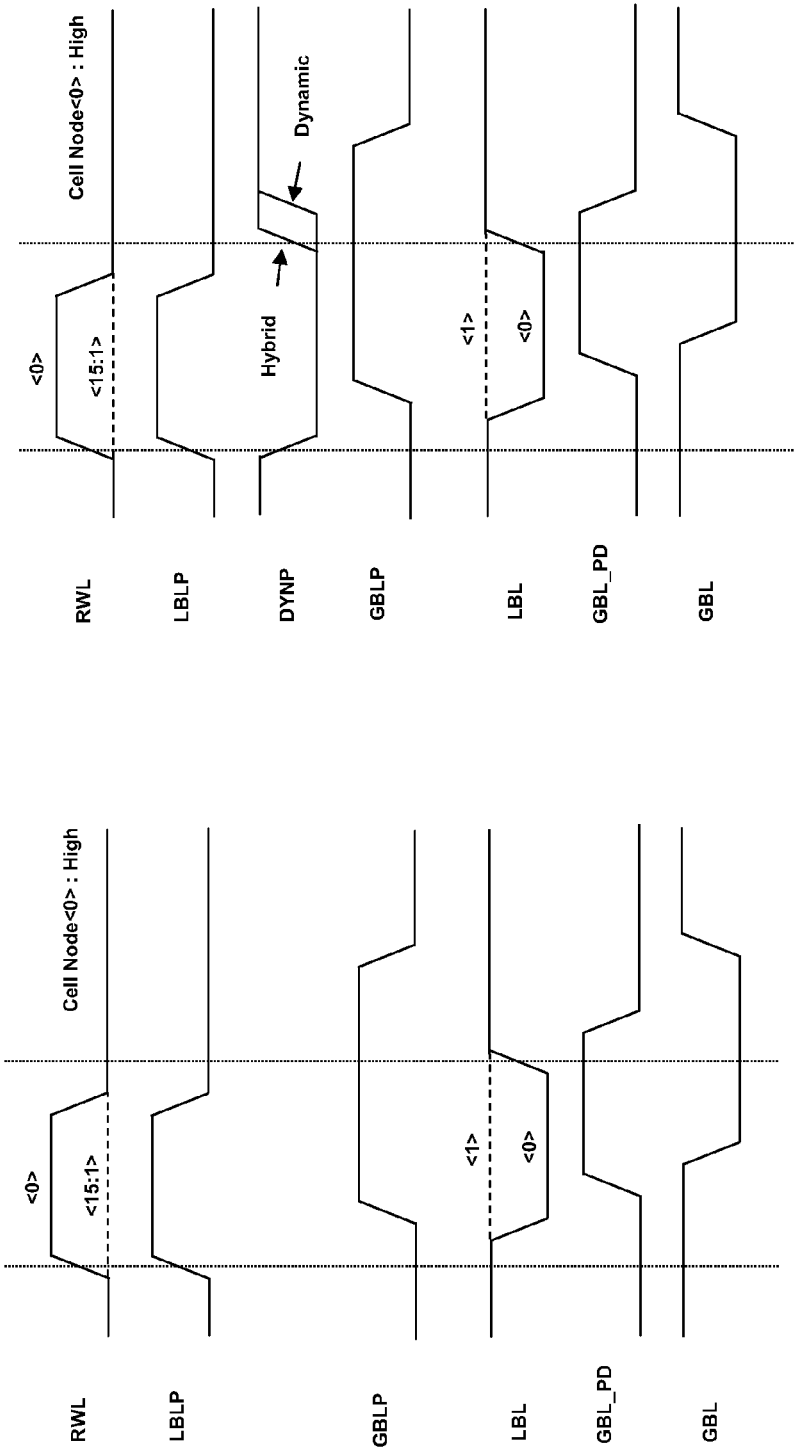
FIG. 2A shows a timing diagram for conventional logic.
FIG. 2B shows a timing diagram for a circuit according to an embodiment of the invention.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

We describe a sensing scheme for memory arrays that has both static and dynamic circuit properties to achieve the best of both types of logic. This hybrid scheme can thus simultaneously provide improved noise immunity over a dynamic circuit and higher performance than a static circuit, thus resulting in a circuit topology with a better noise immunity vs. performance trade-off.

Referring now in specific detail to the drawings, and particularly FIG. 1c, we show an embodiment according to the invention that realizes high-speed sensing by using a skewed static NAND circuit operated as a dynamic circuit with a helper preconditioning device. While conventional NAND sensing is commonly used in SRAM or register file arrays, the hybrid sensing scheme can also be extended to other sensing schemes for different types of memory arrays, in which other logic gates (e.g. inverters or NOR gates) could be used. While the descriptions provided herein pertain to primary sensing of the local bit lines, the same concept could be applied to secondary and higher order sensing stages.

As shown in FIG. 1c, this invention solves the conflicting requirements of noise immunity and high-speed by combining static and dynamic circuit topologies. The NAND circuit itself consists of an extremely skewed static NAND (A0) and an NMOS (N12) helper pre-discharge device.

As in FIG. 1a, N10, N11, P10 and P11 form the static NAND, but the device strengths (conductivity as determined by width and threshold voltage) are chosen such that the switch point of the logic gate is very high—PFETs (positive channel field effect transistors) are relatively much stronger than NFETs (negative channel field effect transistors). A high switch point enables fast sensing because fighting between the NAND transistors is minimized as the output switches quickly. The exact switch point should be set by the desired noise robustness on the LBL as any noise below this level will be rejected by the static CMOS circuit.

A highly skewed static NAND gate on its own, however, while good for sensing speed, is generally very slow in the pre-charge/restore clock phase because the NFETs, which need to be weak to enable a high switch point, are too weak to quickly pull GBL_PD back to ground to reset the circuit for the next read operation. To remedy this, a dynamic pre-discharge device N12 is added to assist in the pre-charge/restore phase of operation. This device is gated by a clock signal DYNP and together with P10 and P11, forms a dynamic NAND. As a result, this hybrid static and dynamic NAND circuit can achieve both good noise immunity and high speed.

Referring now to FIG. 3, Table 1 compares the size, area, capacitance, performance (sensing speed), cycle time (sensing speed+precharge/restore time, which determines operating frequency), and noise immunity by the product of GBL glitch pulse width and voltage) for conventional designs and the invention in a 45 nm CMOS technology. Exemplary device sizes for each case assume a beta ratio (PFET vs. NFET drive strength) of 2.

All numbers are normalized to a balanced static NAND design, in which all device sizes are equal—maximizing noise immunity (most likely unnecessarily large). A highly skewed static NAND (PFET pull-up network is four times stronger than NFET pull-down network) trades off some noise immunity to improve performance by 12% because of the higher NAND switch point, but cycle time is degraded by 62% because the pre-charge/restore phase is lengthened significantly. The dynamic NAND gate significantly improves performance (21%), but it has extremely poor noise immunity. The hybrid NAND gate as described herein provides the best balance of area, performance, cycle time, and noise immunity.

Therefore, while there has been described what is presently considered to be the preferred embodiment, it will understood by those skilled in the art that other modifications can be made within the spirit of the invention. The above description of an embodiment is not intended to be exhaustive or limiting in scope. The embodiments, as described, was chosen in order to explain the principles of the invention, show its practical application, and enable those with ordinary skill in the art to understand how to make and use the invention. It should be understood that the invention is not limited to the embodiments described above, but rather should be interpreted within the full meaning and scope of the appended claims.

The invention claimed is:

1. A semiconductor circuit for sensing logic states in a memory array, the circuit comprising:
   a skewed static logic gate having an output and a plurality of inputs; and
   a dynamic pre-conditioning device coupled with the output of the skewed static logic gate for operating the static logic gate as a dynamic circuit for sensing the logic state in a memory array cell.

2. The semiconductor circuit of claim 1 wherein the skewed static logic gate is a NAND gate.

3. The semiconductor circuit of claim 1 wherein the skewed static logic gate is a NOR gate.

4. The semiconductor circuit of claim 1 wherein the dynamic pre-conditioning device is an NMOS device.

5. The semiconductor circuit of claim 1 wherein the memory array is a static random access memory.

6. The semiconductor circuit of claim 1 wherein the skewed static logic gate is an inverter.

7. The semiconductor circuit of claim 4 wherein the NMOS device comprises:
   a drain coupled to the output of the skewed static logic gate; and
   a source coupled to a ground potential.

8. The semiconductor circuit of claim 1 wherein the memory array comprises a register file array.

9. A hybrid static and dynamic sensing structure for memory arrays, the sensing structure comprising:
   a skewed static logic gate having an output and a plurality of inputs; and
   a dynamic pre-discharge/restore device coupled with the output of the skewed static logic gate for operating the skewed static logic gate as a dynamic circuit for sensing a logic state in a memory array cell.

10. The sensing structure of claim 9 wherein the skewed static logic gate is a NAND gate.

11. The sensing structure of claim 9 wherein the skewed static logic gate comprises a high switch point for enabling fast sensing, wherein the switch point is set according to a desired noise robustness on a local bit line.

12. The sensing structure of claim 9 wherein the pre-discharge/restore device is an NMOS device.

13. The sensing structure of claim 9 wherein the memory array is a static random access memory.

14. The sensing structure of claim 9 wherein the skewed static logic gate is an inverter.

15. The sensing structure of claim 12 wherein the NMOS device has a drain coupled to the output of the skewed static logic gate and a source coupled to a ground potential.

16. The sensing structure of claim 9 wherein the memory array comprises a register file array.

17. The sensing structure of claim 9 wherein the sensing structure is configured for primary and secondary sensing.

18. An information processing system comprising:
   a processor;
   a memory coupled with the processor, the memory comprising a plurality of bit lines and a plurality of byte lines; said memory further comprising a sensing circuit comprising:
   a skewed static logic gate having an output and a plurality of inputs; and
   a dynamic pre-discharge device coupled with the output of the skewed static logic gate for operating the skewed static logic gate as a dynamic circuit for sensing a logic state in a memory array cell.

19. The information processing system of claim 18 wherein the skewed static logic gate is a NAND gate.

20. The information processing system of claim 18 wherein the skewed static logic gate is a NOR gate.

* * * * *